(12) United States Patent
Prall et al.

(10) Patent No.: US 8,129,781 B2
(45) Date of Patent: Mar. 6, 2012

(54) METHOD OF FORMING MEMORY DEVICES BY PERFORMING HALOGEN ION IMPLANTATION AND DIFFUSION PROCESSES

(75) Inventors: Kirk D Prall, Boise, ID (US); Behnam Moradi, Boise, ID (US); Seiichi Aritome, Boise, ID (US); Di Li, Boise, ID (US); Chris Larsen, Manassas, VA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/892,691

(22) Filed: Sep. 28, 2010

(65) Prior Publication Data

US 2011/0013463 A1    Jan. 20, 2011

Related U.S. Application Data

(62) Division of application No. 12/271,132, filed on Nov. 14, 2008, now Pat. No. 7,824,994, which is a division of application No. 11/457,620, filed on Jul. 14, 2006, now Pat. No. 7,485,528.

(51) Int. Cl.
*H01L 21/336* (2006.01)
(52) U.S. Cl. .................................. 257/336; 438/301
(58) Field of Classification Search .................. 257/336, 257/344, 408, E21.435, E29.012, E21.248; 438/301, 514
See application file for complete search history.

(56) References Cited

U.S. PATENT DOCUMENTS

| | | | |
|---|---|---|---|
| 5,994,210 A | 11/1999 | Kerr | |
| 6,074,915 A | 6/2000 | Chen et al. | |
| 6,157,056 A | 12/2000 | Takeuchi et al. | |
| 6,191,975 B1 | 2/2001 | Shimizu et al. | |
| 6,492,690 B2 | 12/2002 | Ueno et al. | |
| 6,521,527 B1 | 2/2003 | Kuroi et al. | |
| 6,703,669 B1 | 3/2004 | Goda et al. | |
| 6,803,276 B2 * | 10/2004 | Kim et al. | 438/257 |
| 6,828,627 B2 | 12/2004 | Goda et al. | |
| 6,900,086 B2 | 5/2005 | Mori et al. | |
| 6,963,105 B2 * | 11/2005 | Hung et al. | 257/315 |
| 6,967,892 B2 | 11/2005 | Tanaka et al. | |
| 2002/0113257 A1 | 8/2002 | Osabe et al. | |
| 2003/0143792 A1 * | 7/2003 | Satoh et al. | 438/197 |
| 2004/0166596 A1 | 8/2004 | Sashida et al. | |
| 2004/0188774 A1 | 9/2004 | Takeda et al. | |

(Continued)

OTHER PUBLICATIONS

Hook et al., "The effects of fluorine on Parametrics and reliability in a 0.18-um 3.5/6.8nm dual gate oxide CMOS Technology", IEEE Transactions on Electron Devices, 48:1346-53, 2001.

(Continued)

*Primary Examiner* — Thao Le
(74) *Attorney, Agent, or Firm* — Wells St. John P.S.

(57) ABSTRACT

Disclosed is a method of forming memory devices employing halogen ion implantation and diffusion processes. In one illustrative embodiment, the method includes forming a plurality of word line structures above a semiconducting substrate, each of the word line structures comprising a gate insulation layer, performing an LDD ion implantation process to form LDD doped regions in the substrate between the word line structures, performing a halogen ion implantation process to implant atoms of halogen into the semiconducting substrate between the word line structures, and performing at least one anneal process to cause at least some of the atoms of halogen to diffuse into the gate insulation layers on adjacent word line structures.

7 Claims, 11 Drawing Sheets

U.S. PATENT DOCUMENTS

| | | |
|---|---|---|
| 2005/0133831 A1 | 6/2005 | Cheng et al. |
| 2005/0227440 A1 | 10/2005 | Ema et al. |
| 2005/0243601 A1 | 11/2005 | Harari |
| 2005/0277251 A1 | 12/2005 | Lee et al. |
| 2005/0280000 A1 | 12/2005 | Ishii et al. |
| 2006/0118847 A1 | 6/2006 | Takamatsu et al. |
| 2006/0118855 A1 | 6/2006 | Lee et al. |
| 2006/0121685 A1 | 6/2006 | Izumi |
| 2006/0151821 A1 | 7/2006 | Melik-Martirosian et al. |
| 2006/0175642 A1 | 8/2006 | Dote et al. |
| 2006/0234455 A1 | 10/2006 | Chen et al. |
| 2007/0166912 A1 | 7/2007 | Fenigstein et al. |
| 2007/0238234 A1 | 10/2007 | Wang et al. |

OTHER PUBLICATIONS

Nguyen et al., "Effects of Fluorine Implants on Induced Charge Components in Gate-Oxides Under Constant-Current Fowler-Nordheim Stress", IEEE Transactions on Electron Devices, 44:1432-40, 1997.

Nishioka et al., "Dramatic Improvement of Hot-Electron-Induced Interface Degradation in MOS Structures Containing F or CI in Si02", IEEE Electron Letters, 9:38-40, 1988.

Wright et al., "The effects of fluorine on Gate Dielectric Properties", IEDM 574-577, 1987.

* cited by examiner

METHOD OF FORMING MEMORY DEVICES BY PERFORMING HALOGEN ION IMPLANTATION AND DIFFUSION PROCESSES

RELATED PATENT DATA

This patent resulted from a divisional application of U.S. patent application Ser. No. 12/271,132, filed Nov. 14, 2008, entitled "Method of Forming Memory Devices by Performing Halogen Ion Implantation and Diffusion Processes", naming Kirk Prall, Behnam Moradi, Seiichi Aritome, and De Li as inventors, and which was a divisional application of U.S. patent application Ser. No. 11/457,620, filed Jul. 14, 2006, entitled "Method of Forming Memory Devices by Performing Halogen Ion Implantation and Diffusion Processes", naming Kirk D. Prall, Behnam Moradi, Seiichi Aritome, Di Li and Chris Larsen as inventors, and which is now U.S. Pat. No. 7,485,528, all the disclosures of which is incorporated by reference.

BACKGROUND OF THE INVENTION

1. Field of the Invention

The present invention is generally directed to the field of manufacturing integrated circuit devices, and, more particularly, to a method of forming memory devices by performing halogen ion implantation and diffusion processes 2. Description of the Related Art Manufacturing integrated circuit devices is a very competitive and complex undertaking. Customers frequently demand that such integrated circuit devices exhibit increased performance capabilities as successive generations of products are produced. This is particularly true in the field of manufacturing memory devices, such as flash memory devices.

Flash memory devices are in widespread use in modern electronic devices, e.g., PDAs, cell phones, etc. A typical flash memory device comprises a so-called tunnel oxide layer, a floating gate, an inter-gate or inter-poly layer 26 (e.g., an ONO (oxide-nitride-oxide) stack), and a control gate. Such devices are well known in the art.

In operation, a voltage is applied to the control gate and to the source region of the flash memory device. Such voltage causes electrons to tunnel through the tunnel oxide layer and become trapped in the floating gate. The presence or absence of this trapped charge can be detected and represents a bit of information, i.e., a "1" or a "0". To delete this charge, a different voltage is applied to the control gate and a drain region of the memory device. During this process, the electrons trapped in the floating gate tunnel back through the tunnel oxide layer, thereby depleting the charge on the floating gate.

Flash memory cells are subjected to thousands of programming and erase operations during normal operations. The effectiveness and speed of such programming and erase cycles can degrade over time, e.g., after a flash memory cell has been subjected to 10,000 or more program and erase cycles. Such degradation may be due, at least in part, to charges being trapped in the so-called tunnel oxide layer of a typical flash memory device.

Flash memory devices may have a well-known NAND configuration in which the memory cells are connected in series. Such NAND architecture employs one or more select gate structures that are used to control access to the memory cells. Typically, the LDD implant regions adjacent the select gate structures and the word line structures in the cell array are formed at the same time using the same implant process. However, such a process flow is undesirable from a performance optimization viewpoint. More specifically, all other things being equal, it would be desirable for the LDD regions in the cell area to be relatively shallow to thereby reduce short channel effects on the cell devices. In contrast, the doped regions for the select gate structure would preferably be relatively deep to reduce adverse effects such as gate induced drain leakage (GIDL).

The present invention is directed to a device and various methods that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present invention is generally directed to a method of forming memory devices employing halogen ion implantation and diffusion processes. In one illustrative embodiment, the method comprises forming a plurality of word line structures above a semiconducting substrate, each of the word line structures comprising a gate insulation layer, performing an LDD ion implantation process to form LDD doped regions in the substrate between the word line structures, performing a halogen ion implantation process to implant atoms of halogen into the semiconducting substrate between the word line structures, and performing at least one anneal process to cause at least some of the atoms of halogen to diffuse into the gate insulation layers on adjacent word line structures.

In another illustrative embodiment, the method comprises forming a plurality of word line structures above a semiconducting substrate, each of the word line structures comprising a gate insulation layer, performing an LDD ion implantation process to form LDD doped regions in the substrate between the word line structures, performing a fluorine ion implantation process to implant fluorine atoms into the semiconducting substrate between the word line structures, and performing at least one anneal process to cause at least some of the fluorine atoms to diffuse into the gate insulation layers on adjacent word line structures.

In yet another illustrative embodiment, the method comprises forming a plurality of word line structures above a semiconducting substrate, each of the word line structures comprising a gate insulation layer, performing an LDD ion implantation process to form LDD doped regions in the substrate between the word line structures, performing a fluorine ion implantation process to implant fluorine atoms into the LDD doped regions, and performing at least one anneal process to cause at least some of the fluorine atoms to diffuse into the gate insulation layers on adjacent word line structures.

In a further illustrative embodiment, the method comprises forming a plurality of word line structures and at least one select gate structure above a semiconducting substrate, performing an LDD ion implantation process to form LDD doped regions adjacent the word line structures and the at least one select gate structure, performing a halogen ion implantation process to implant atoms of halogen into the semiconducting substrate between the plurality of word line structures, and performing at least one anneal process whereby, after the anneal process, the LDD regions for the word line structures have a shallower depth than the LDD regions for the at least one select gate structure.

In yet a further illustrative embodiment, the method comprises forming a plurality of word line structures and at least one select gate structure above a semiconducting substrate, performing an LDD ion implantation process to form LDD doped regions adjacent the word line structures and the at least one select gate structure, performing a fluorine ion implantation process to implant fluorine atoms into the LDD regions for the plurality of word line structures, and performing at least one anneal process whereby the LDD regions for the word line structures have a shallower depth than the LDD regions for the at least one select gate structure.

In still another illustrative embodiment, the method comprises forming a plurality of word line structures and at least one select gate structure above a semiconducting substrate, performing an LDD ion implantation process to form LDD doped regions adjacent the word line structures and the at least one select gate structure, performing a fluorine ion implantation process to implant fluorine atoms into the LDD regions for the plurality of word line structures but not into the LDD regions for the at least one select gate structure, and performing at least one anneal process whereby the LDD regions for the word line structures have a shallower depth than the LDD regions for the select gate structures.

In one illustrative embodiment, the memory device comprises a plurality of word line structures and at least one select gate structure positioned above a semiconducting substrate and a plurality of LDD doped regions formed in the substrate adjacent the word line structures and the at least one select gate structure, wherein the LDD regions for the word line structures have a shallower depth than the LDD regions for the at least one select gate structure.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various regions and structures of an integrated circuit device are depicted in the drawings. For purposes of clarity and explanation, the relative sizes of the various features and regions depicted in the drawings may be exaggerated or reduced as compared to the size of those features or structures on real-world integrated circuit devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be explicitly set forth in the specification in a definitional manner that directly and unequivocally provides the special definition for the term or phrase.

Figure 1:
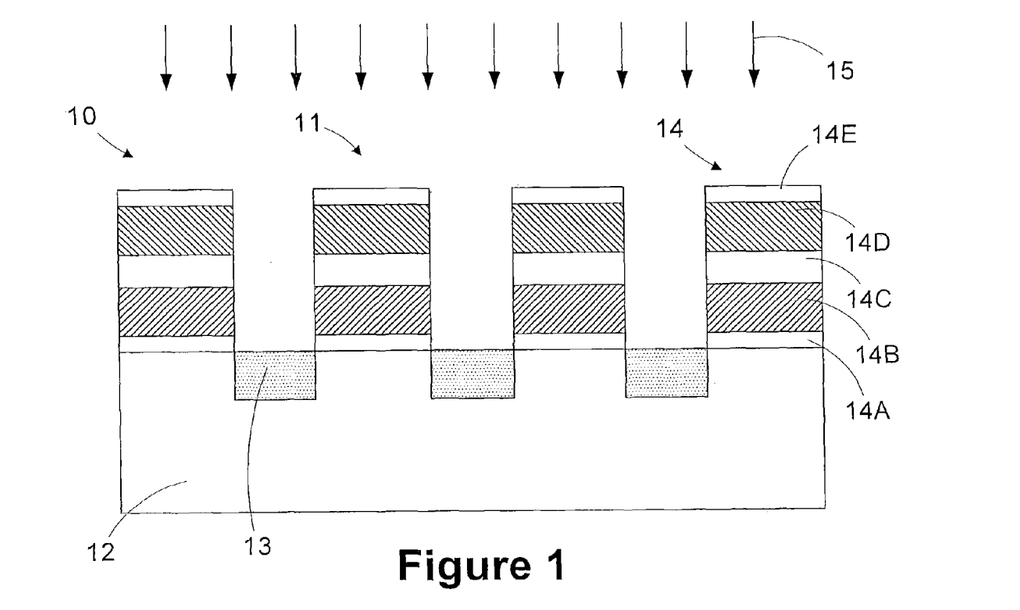
FIGS. 1-3 depict one illustrative embodiment of the present invention wherein halogen ions are introduced into the gate insulation layer of illustrative word line structures.
Figure 2:
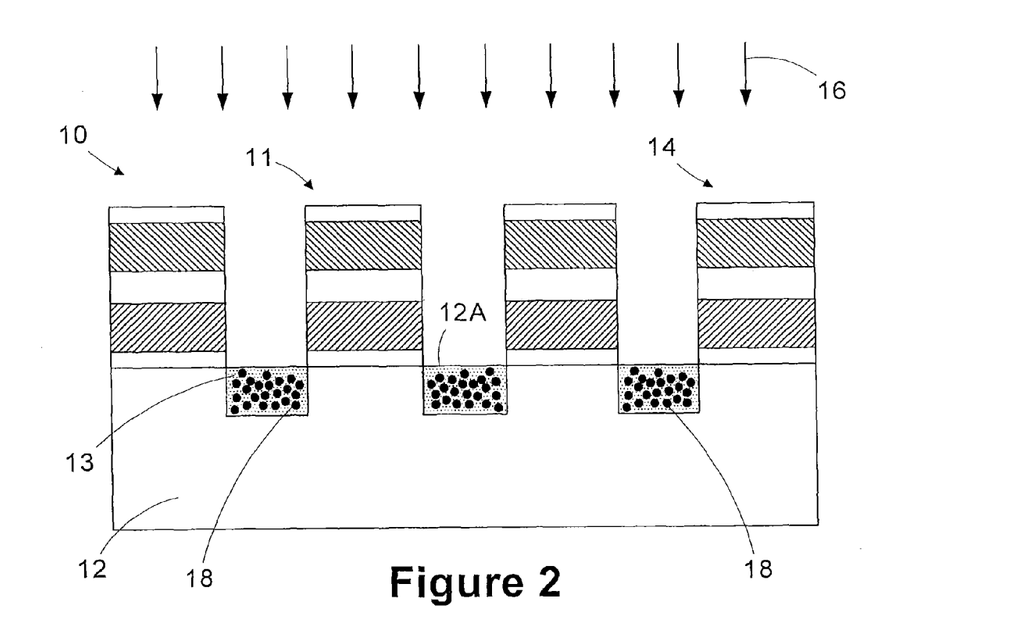

In one illustrative aspect, the present invention is directed to introducing halogen ions, e.g., fluorine, chlorine, bromine, etc., into the gate insulating layer of a memory device by performing an ion implantation process followed by a diffusion process. FIGS. 1 and 2 will be used to describe this illustrative aspect of the present invention.

FIG. 1 depicts a portion of an illustrative memory device 10, e.g., a flash memory device. An illustrative portion of the cell array 11 of the memory device 10 is also depicted in FIG. 1. The cell array 11 comprises a plurality of word line structures 14 that may be formed in accordance with known techniques. For example, the illustrative word line structures 14 may comprise a gate insulation layer 14A (sometimes referred to as a tunnel oxide layer), a floating gate 14B, an inter-gate insulating layer 14C (sometimes referred to as an inter-poly insulating layer), a control gate 14D and a cap layer 14E. The materials used to form the various components of the word line structure 14 may vary depending upon the particular application. For example, the gate insulation layer 14A may be comprised of silicon dioxide, the floating gate structures 14B and control gate structures 14D may be comprised of doped polysilicon, the inter-gate insulating layer 14C may be comprised of a layer of silicon nitride positioned between two layers of silicon dioxide (a so-called "ONO" stack), and the cap layer 14E may be comprised of silicon nitride.

Initially, an ion implantation process, as indicated by the arrows 15, is performed to introduce a dopant material to thereby form LDD doped regions 13 in the semiconducting substrate 12. The implant process 15 may be performed in accordance with standard processing techniques. For example, arsenic or phosphorous atoms may be implanted during the ion implant process 15 to form the LDD doped regions 13. The dopant material and concentration of dopant atoms used to form the doped implant regions 13 may vary depending upon the particular application. Thus, the illustrative examples described herein should not be considered a limitation of the present invention.

In one embodiment, as shown in FIG. 2, after the doped regions 13 are formed, a masking layer (not shown), e.g., a photoresist mask, is provided that exposes the cell area 11 of the memory device 10. Thereafter, a halogen ion implantation process, as indicated by the arrows 16, is performed to introduce halogen ions 18 into the semiconducting substrate 12. As will be appreciated by those skilled in the art after a complete reading of the present application, the halogen implant process 16 may be performed before or after the doped regions 13 are formed in the substrate 12. Thus, the illustrative process flow described in detail herein, wherein the halogen implant process 16 is performed after the doped regions 13 are formed, should not be considered a limitation of the present invention.

The particular dopant material, as well as the dopant dose and energy level, employed during the halogen ion implant process 16 may vary depending upon the particular application. Typically, the dopant dose and energy level are selected such that the halogen ions 18 only extend into the substrate 12 for a sufficient depth such that they do not readily diffuse out of the surface 12A during a subsequent anneal process that is described more fully below. For purposes of explanation, the implanted ions 18 have been depicted as relatively large black dots. The halogen implant process 16 may be performed using a variety of materials, e.g., fluorine, chlorine, bromine, etc. In one particularly illustrative embodiment, the halogen implant process 16 is performed with fluorine, and the dopant dose is approximately $1e^{13}$-$5e^{14}$ ions/cm$^2$ at an energy level of approximately 20-30 keV. The dose of the halogen ions is selected such that thickening of the insulating layer 14A (e.g., the tunnel oxide layer) may be reduced or prevented.

Figure 3:
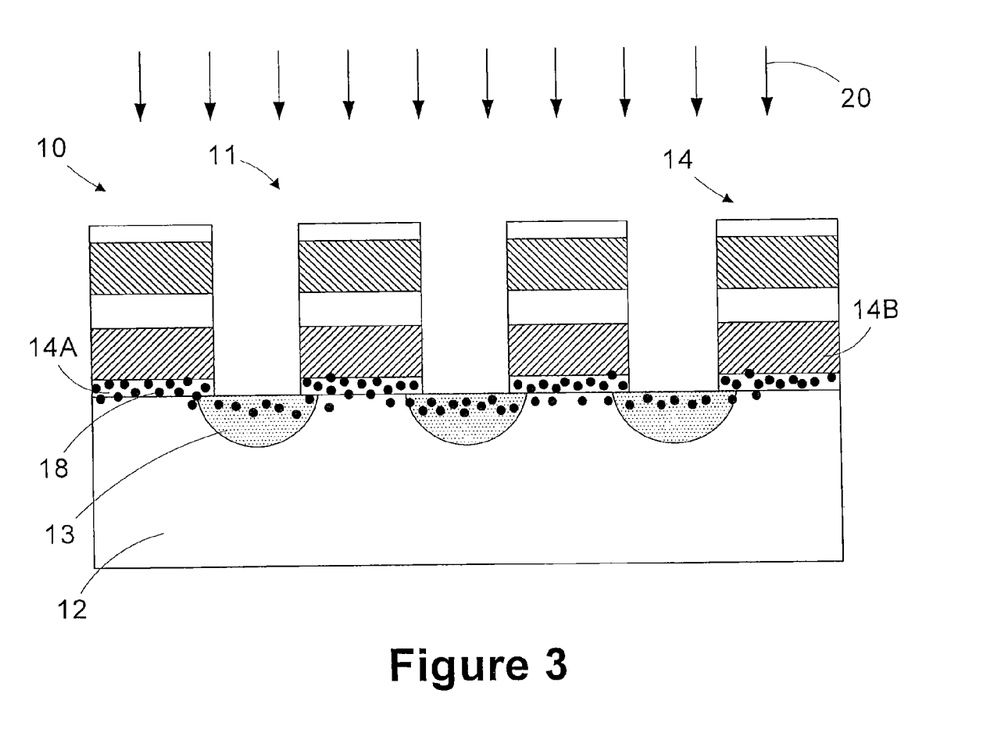

Next, as shown in FIG. 3, an anneal process 20 is performed. The anneal process 20 may be performed in a single step or in multiple steps. The purpose of the anneal process(es) 20 is to, among other things, cause the implanted halogen atoms to diffuse outwardly into the tunnel oxide layers 14A of the various word line structures 14 in the cell array 11 of the memory device 10. The anneal process(es) 20 may also assist in repairing any damage to the lattice structure of the substrate 12 due to the implant processes 15 and activate any implanted dopant materials. The anneal process(es) 20 may be a rapid thermal anneal process, a rapid thermal oxidation process, a radical oxidation process, etc. The anneal process(es) 20 may be performed in any process tool capable of achieving the objective described herein, e.g., a furnace, a rapid thermal anneal chamber, etc. The parameters of the anneal process(es) 20 may also vary. In one particularly illustrative embodiment, a single anneal process 20 is performed in a rapid thermal anneal chamber at a temperature of approximately 800-1100° C. for a duration of approximately 50-70 seconds.

As shown in FIG. 3, as a result of the anneal process(es) 20, the halogen ions 18 have outwardly diffused into the gate insulation layers 14A of adjacent word line structures 14. The extent to which the halogen ions 18 outwardly diffuse can be controlled by controlling the parameters, e.g., time, temperature, of the anneal process(es) 20. After the anneal process(es) 20 have been performed, then the memory device 10 may be completed using known processing techniques, which are not shown so as not to obscure the present invention.

Figure 4:
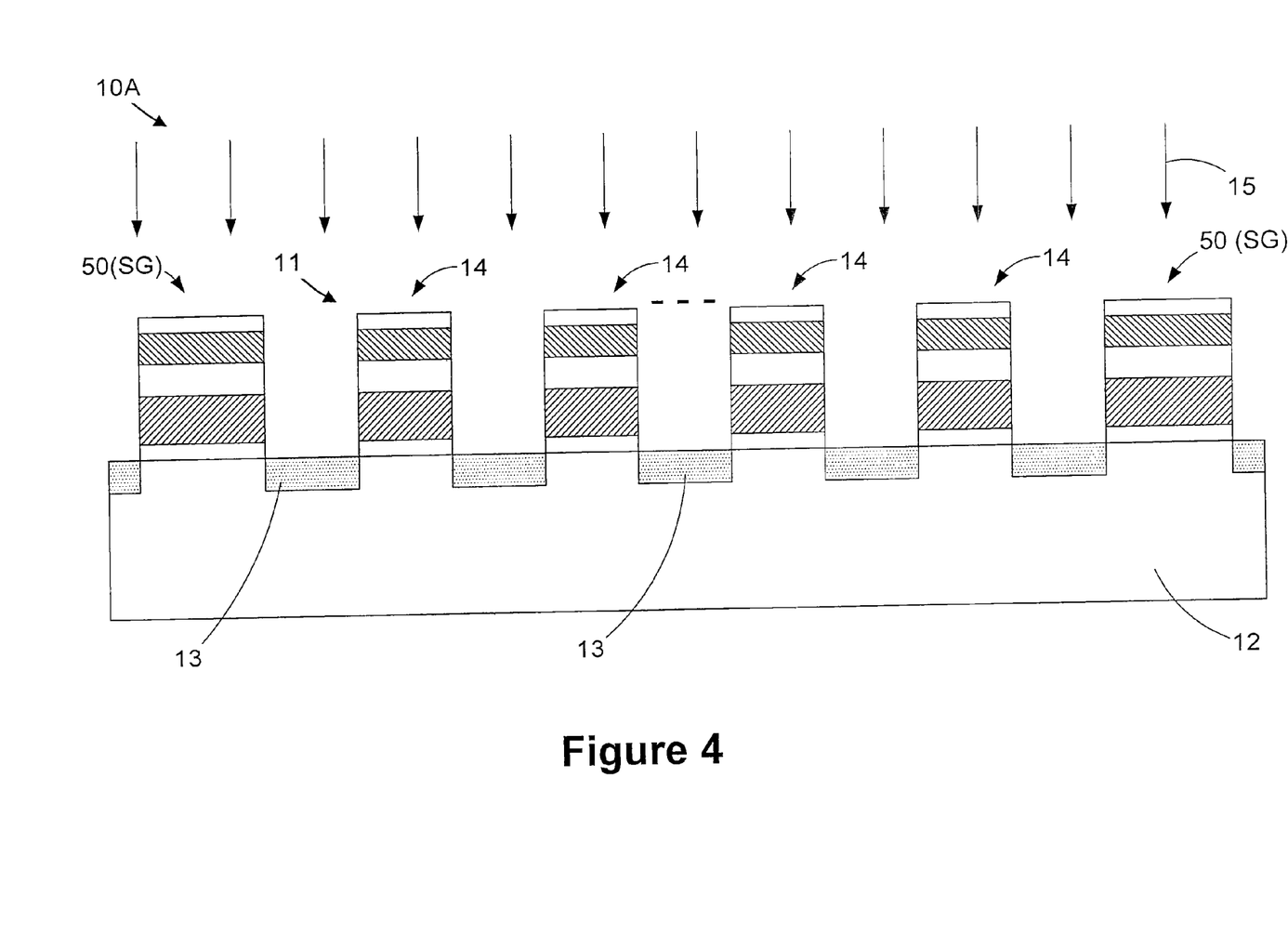
FIGS. 4-6 depict one illustrative technique for varying the depth of doped regions adjacent word line structures and select gate structures.

Various other aspects of the present invention will now be described with reference to FIGS. 4-12. FIG. 4 depicts a memory device 10A having an illustrative NAND cell array 11. The memory device 10A is comprised of a plurality of word lines structures 14 and a plurality of select gate structures 50. A series of three dashes (---) is included in FIG. 4 as an indication that only four of the illustrative word line structures 14 are depicted in FIG. 4. As is well known to those skilled in the art, an actual memory device 10A comprises many more word line structures 14 in a typical NAND cell array 11.

As indicated in FIG. 4, the ion implant process 15 described above is performed to form LDD doped regions 13 in the semiconducting substrate 12 adjacent the word line structures 14 and the select gate structures 50. The materials, dopant dose and energy level for the implant process 15 may vary depending upon the particular application.

Figure 5:
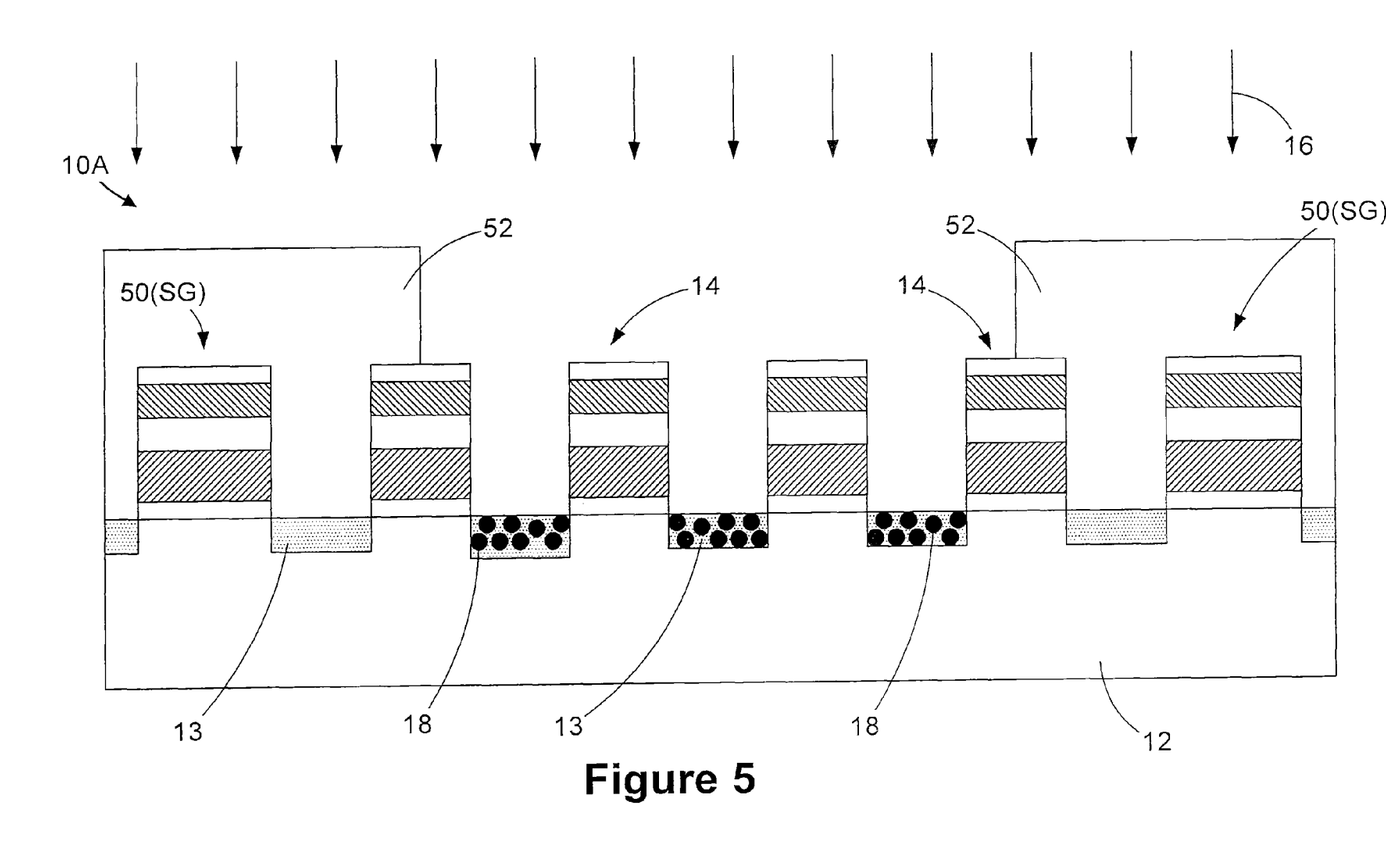

Next, as indicated in FIG. 5, a masking layer 52, e.g., photoresist, is formed so as to completely cover the select gate structures 50 and their associated doped regions 13, while leaving the word line structures 14 and their associated doped regions exposed. Thereafter, the halogen implant process 16 is performed to introduce halogen ions 18 into the doped regions 13. As with the embodiment depicted in FIGS. 1 and 2, the halogen implant process 16 may be performed before or after the LDD doped regions 13 are formed.

Figure 6:
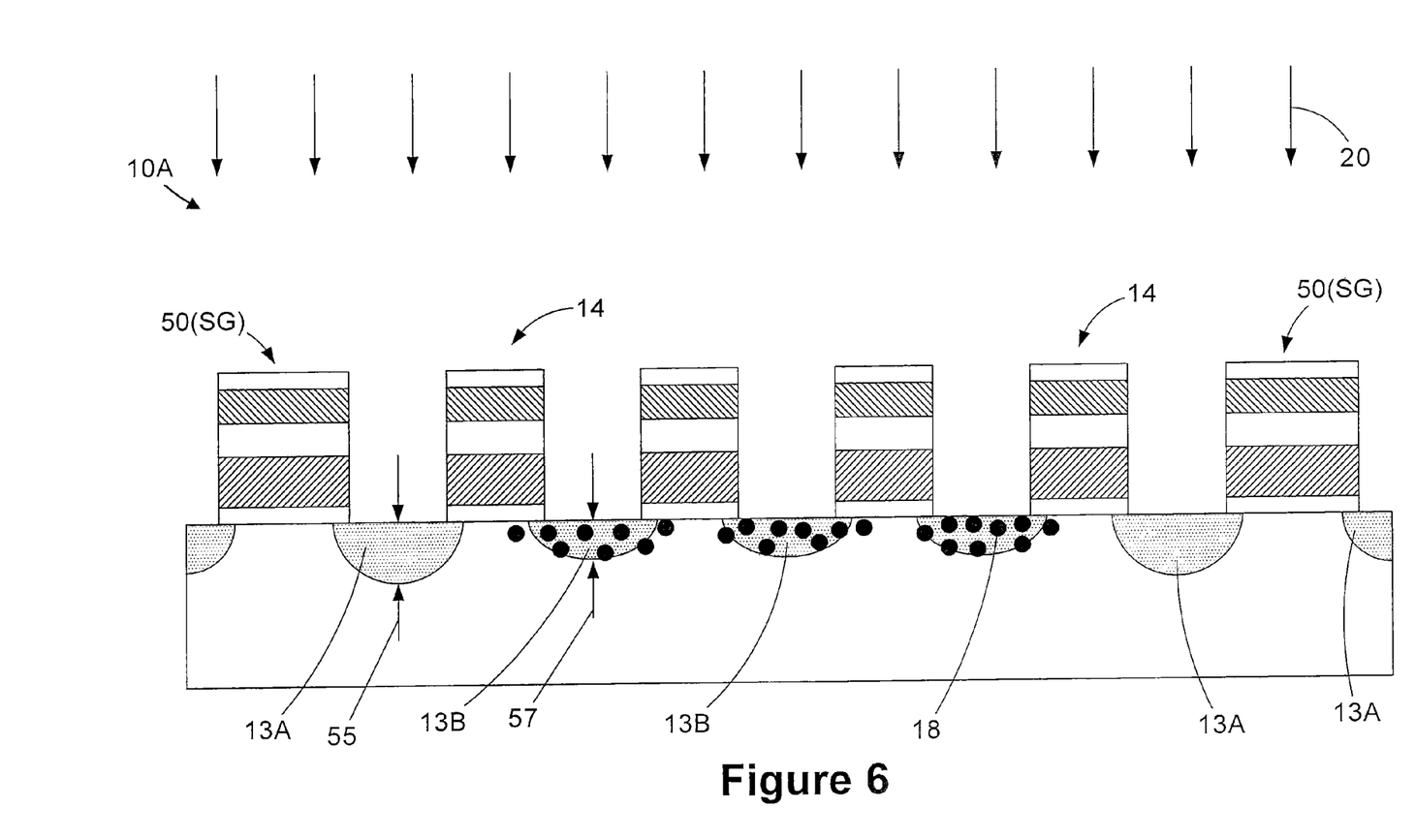

Thereafter, as shown in FIG. 6, the masking layer 52 is removed and the anneal process(es) 20 is performed to repair the damage to the lattice structure of the semiconducting substrate 12 and to activate the dopant material implanted into the doped regions 13. The implanted halogen ions 18 reduce the rate of diffusion of the ions implanted to form the LDD doped regions 13. Accordingly, as depicted in FIG. 6, the atoms in the doped regions 13A adjacent the select gate structures 50 diffuse more readily than the atoms in the doped regions 13B adjacent the word line structures 14. More specifically, the doped regions 13A have a depth 55 that is greater than the depth 57 of the doped regions 13B formed adjacent the word line structures 14. For example, the doped regions 13A may have a depth 55 that ranges from approximately 800-2000 Å, whereas the doped regions 13B may have a depth 57 that ranges from approximately 600-1500 Å. Stated another way, the depth 57 of the doped regions 13B may be approximately 30-60% of the depth 55 of the doped regions 13A.

Figure 7:
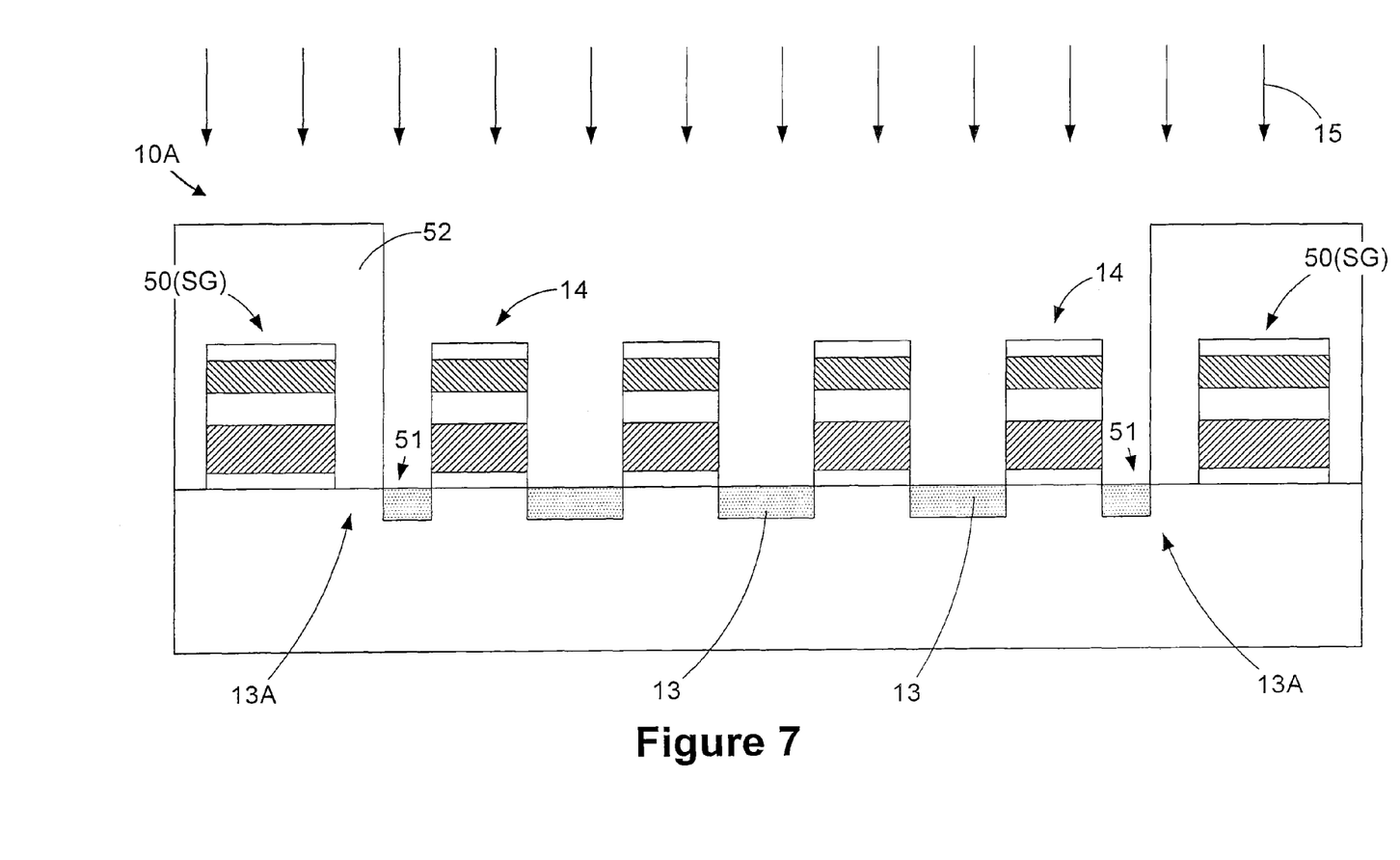
FIGS. 7-9 depict another illustrative technique for varying the depth of doped regions adjacent word line structures and select gate structures.
Figure 8:
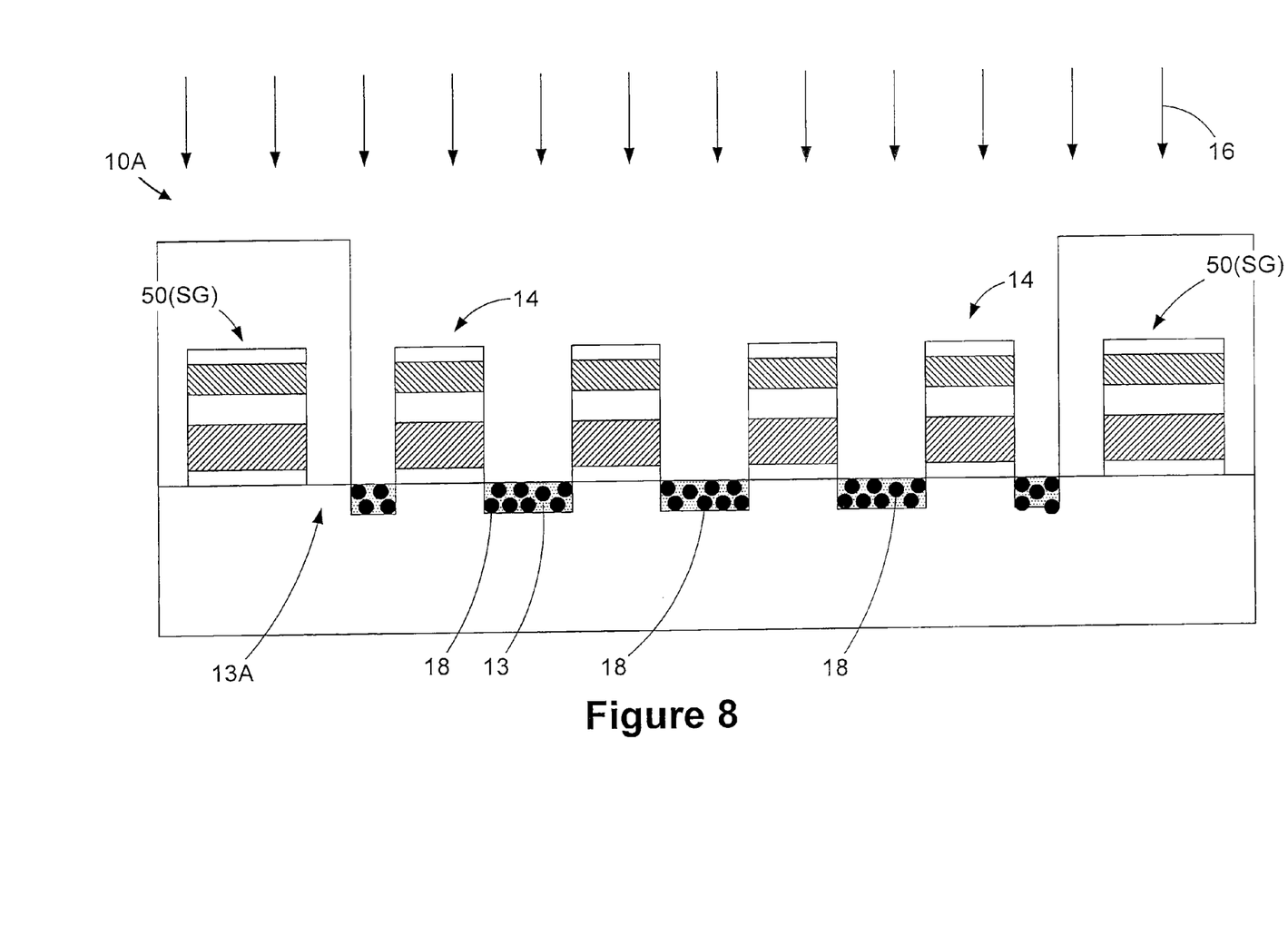
Figure 9:
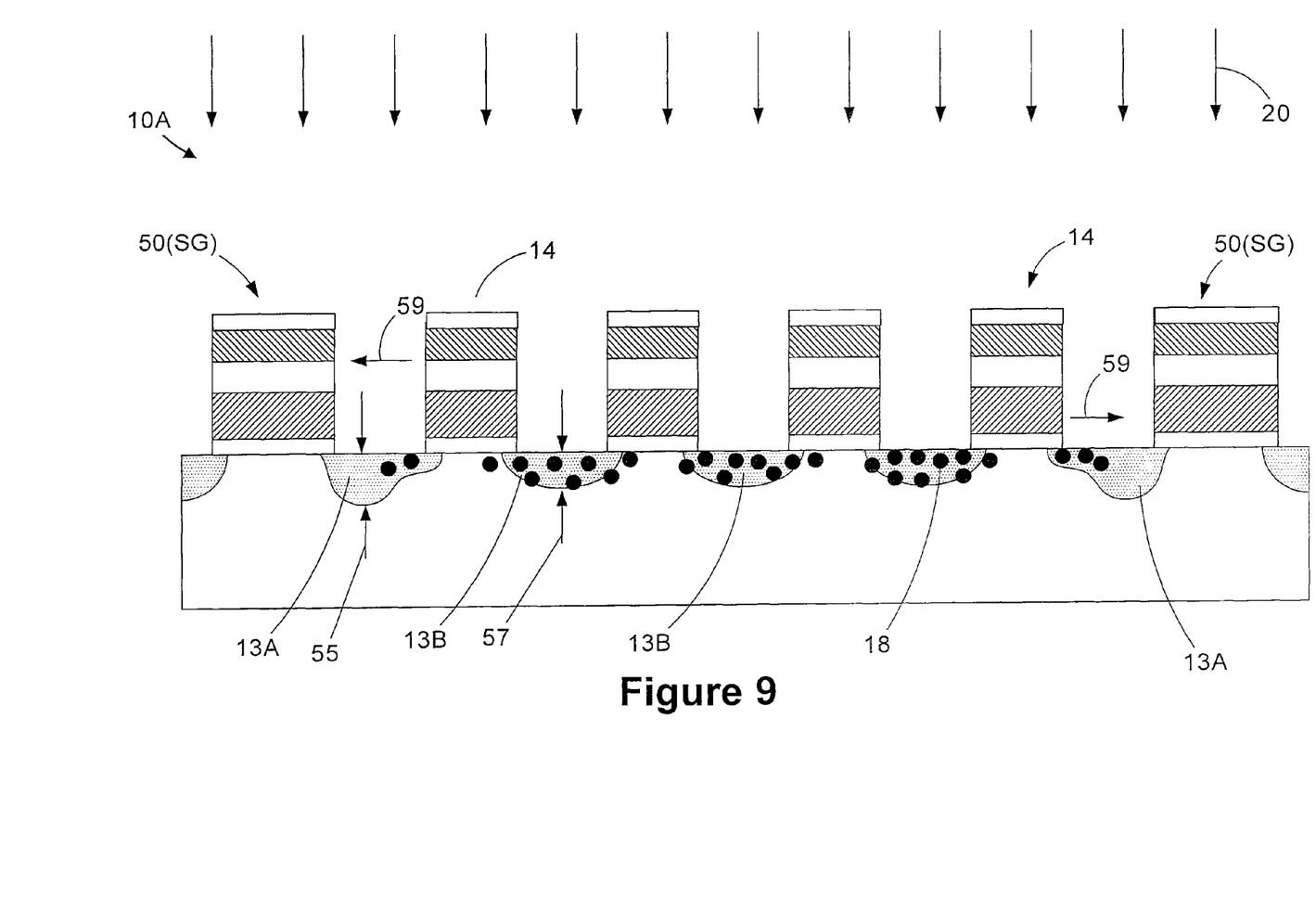

FIGS. 7-9 depict another illustrative embodiment of the present invention. In this particular embodiment, the masking layer 52 is formed such that a portion 51 of the area of the substrate 12 where the doped region 13A will be formed for the select gate structures 50 is exposed to the implant process 15 used to form the LDD doped regions 13.

Next, as shown in FIG. 8, the halogen implant process 16 is performed to introduce halogen ions 18, e.g., fluorine, chlorine, etc., into the substrate 12. Then, as shown in FIG. 9, the anneal process(es) 20 is performed to repair the lattice damage to the substrate 12 and to activate the dopant materials implanted into the doped regions 13. Due to the presence of the halogen ions 18, the diffusion rate of the dopants implanted into the doped regions 13 is reduced. This results, as before, with the doped regions 13A adjacent the select gate structures 50 having a greater depth 55 than the depth 57 of the doped regions 13B adjacent the word line structures 14. Note that, due to allowing the halogen ions 18 to be implanted into a portion 51 of the area for the doped regions 13A of the select gate structures 50, the doped regions 13A have a unique profile. More specifically, the depth of the doped regions 13B gradually increases in the direction indicated by the arrow 59 as it progresses toward the select gate structure 50. The maximum depth 55 of the doped regions 13 occurs slightly beyond the mid-point distance between the word line structure 14 and the select gate structure 50.

Figure 10:
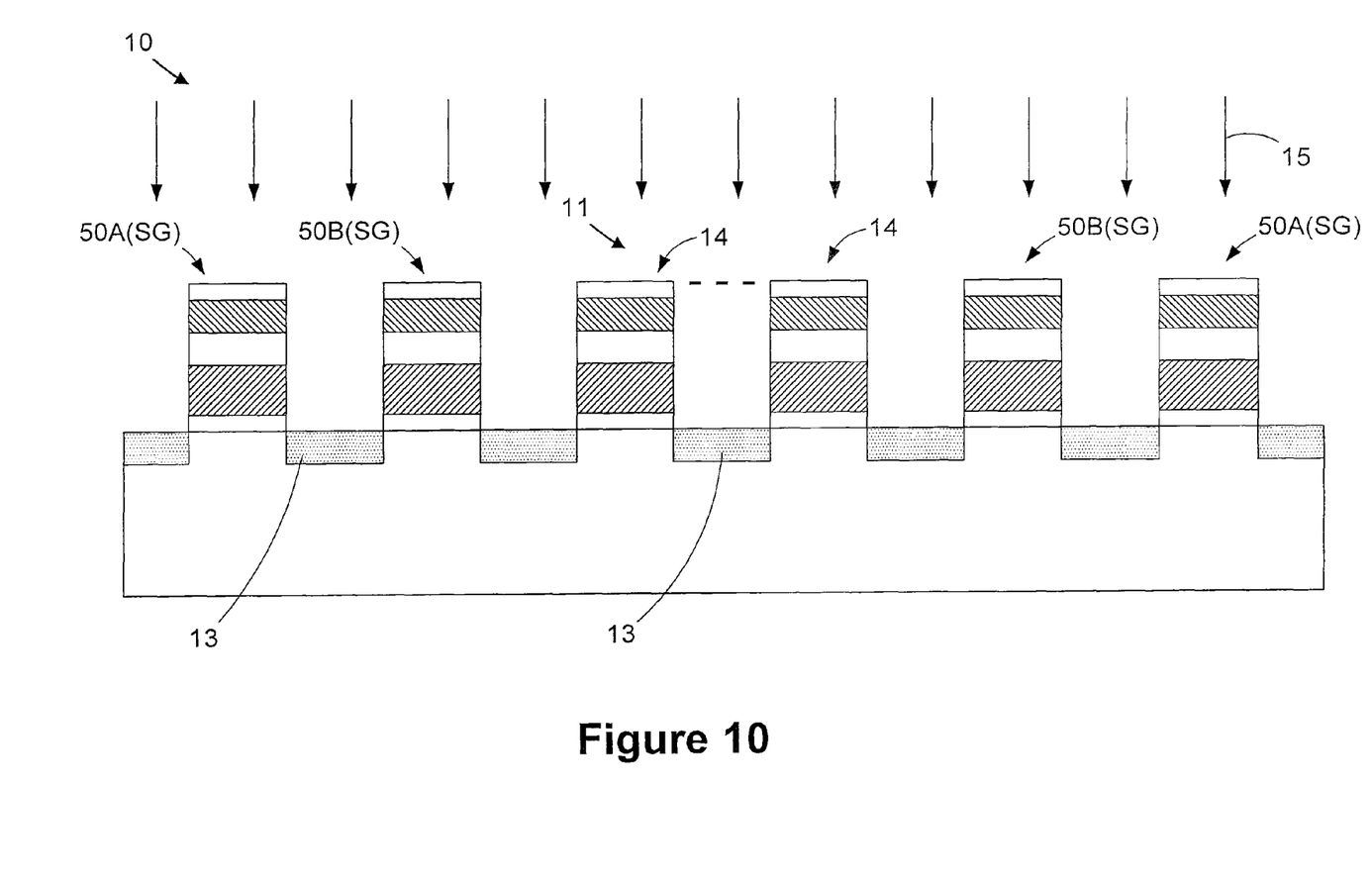
FIGS. 10-12 depict yet another illustrative technique for varying the depth of doped regions adjacent word line structures and select gate structures.
Figure 11:
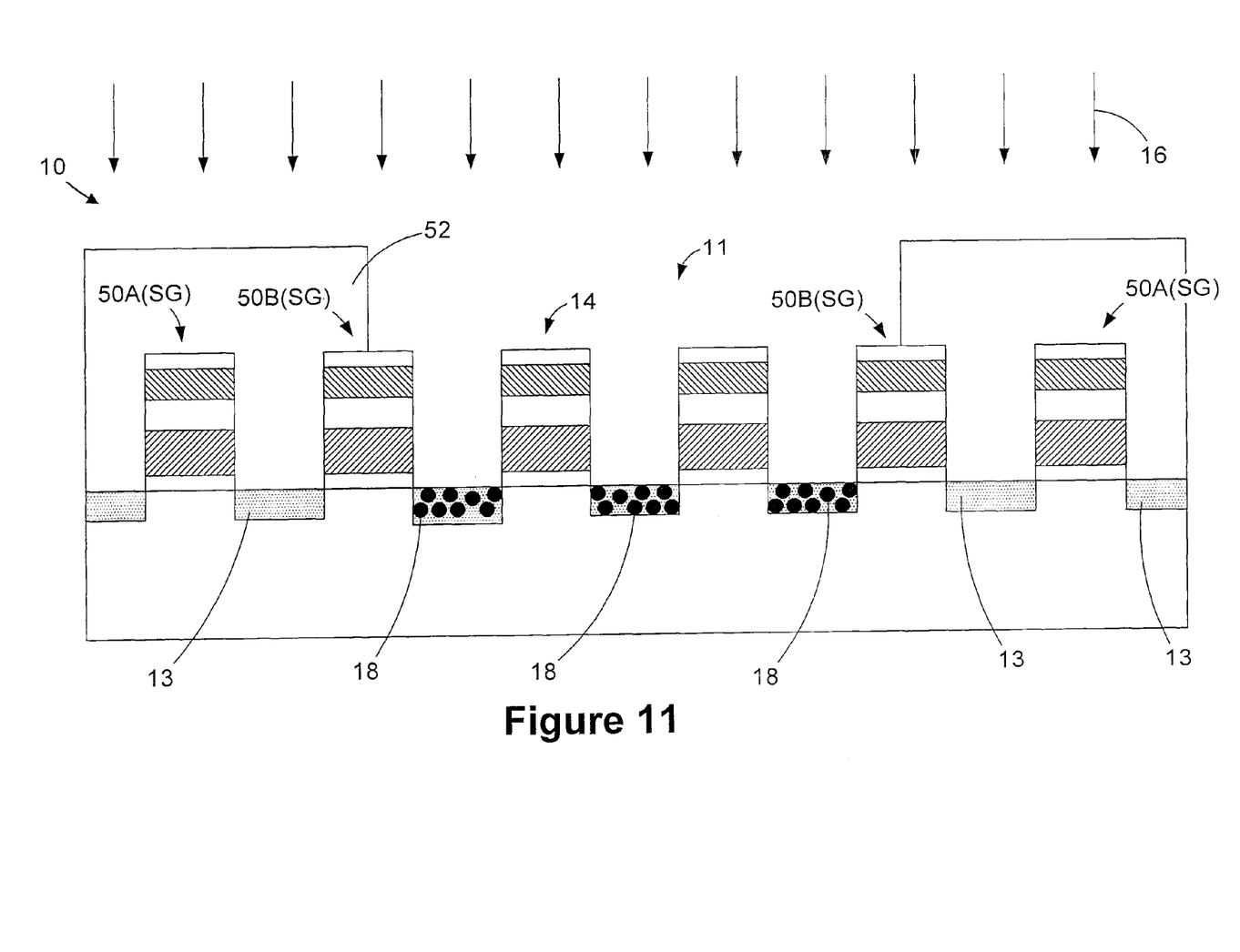
Figure 12:
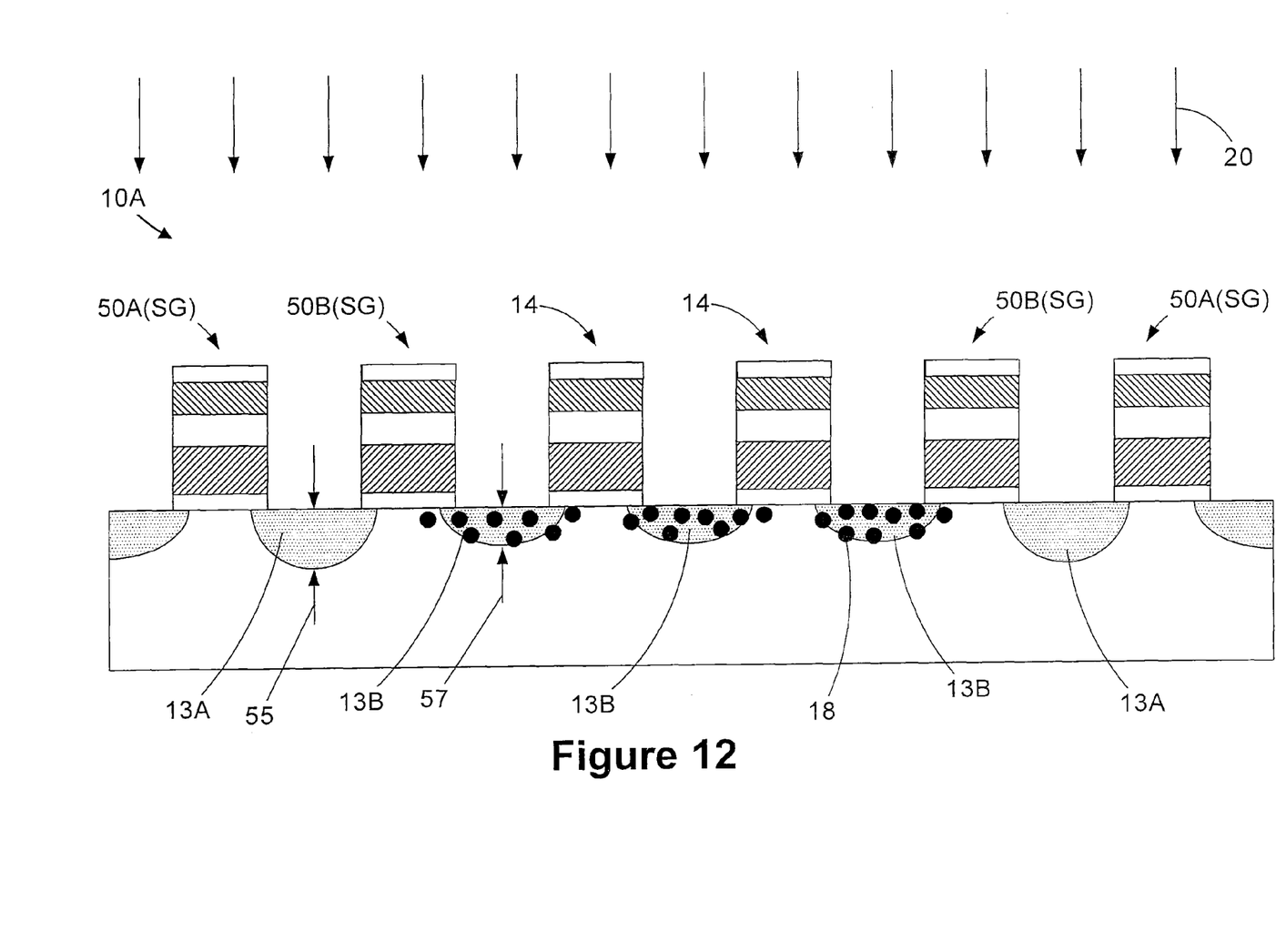

FIGS. 10-12 depict yet another illustrative aspect of the present invention. In this particular embodiment, the memory device 10A comprises two select gate structures 50A, 50B on each end of the cell array 11. As shown in FIG. 10, the implant process 15 is performed to form the LDD doped regions 13 in the substrate 12. Next, as shown in FIG. 11, the masking layer 52 is formed such that the entire doped region 13 between the innermost select gate structure 50B and the cell array 11 is exposed. Thereafter, the halogen implant process 16 is performed to introduce halogen ions 18, e.g., fluorine, chlorine, etc., into the substrate 12. As shown in FIG. 12, the anneal process(es) 20 is then performed to repair the lattice damage to the substrate 12 and to activate the dopant materials implanted into the doped regions 13. Due to the presence of the halogen ions 18, the diffusion rate of the dopants implanted into the regions 13 is reduced. This results, as before, with the doped regions 13A that were not subjected to the halogen implant process 16 having a greater depth 55 than the depth 57 of the doped regions 13B subjected to the halogen implant process 16. In this embodiment, a relatively shallow doped region 13B and a relatively deep doped region 13A are positioned adjacent to the innermost select gate structure 50B.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A memory device, comprising:
    a plurality of word line structures and at least one select gate structure positioned above a semiconducting substrate; and
    a plurality of LDD doped regions formed in said substrate adjacent said word line structures and said at least one select gate structure, wherein said LDD regions for said word line structures have a shallower depth than said LDD regions for said at least one select gate structure.

2. The device of claim 1, wherein said semiconducting substrate comprises silicon.

3. The device of claim 1, wherein said LDD regions for said word line structures comprise halogen ions.

4. The device of claim 1, wherein said LDD regions for said word line structures and said at least one select gate structure comprise arsenic.

5. The device of claim 3, wherein said halogen ions comprise at least one of fluorine, chlorine and bromine.

6. The device of claim 1, wherein said LDD regions for said word line structures have a depth that is approximately 30-60% of a depth of said LDD regions for said at least one select gate structure.

7. The device of claim 1, wherein said memory device is a flash memory device.

* * * * *